(12) United States Patent
Yenni, Jr. et al.

(10) Patent No.: US 6,485,595 B1
(45) Date of Patent: *Nov. 26, 2002

(54) EMI SHIELDING ENCLOSURES

(75) Inventors: Donald M. Yenni, Jr., Round Rock, TX (US); Jose P. de Souza, Austin, TX (US); Mark G. Baker, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 300 days.

This patent is subject to a terminal disclaimer.

(21) Appl. No.: 09/610,739

(22) Filed: Jul. 6, 2000

Related U.S. Application Data

(62) Division of application No. 09/070,994, filed on May 1, 1998, now Pat. No. 6,090,728.

(51) Int. Cl.⁷ .............................................. B32B 15/08
(52) U.S. Cl. ................ 156/221; 156/196; 156/309.6; 361/818; 257/660; 174/356 C
(58) Field of Search .................... 361/818; 257/659, 257/660; 174/35 GC, 35 MS; 156/196, 221, 309.6, 308.2

(56) References Cited

U.S. PATENT DOCUMENTS

| | | | |
|---|---|---|---|
| 3,727,292 A | 4/1973 | Nicely | 29/419 |
| 4,661,888 A | 4/1987 | Jewell et al. | 361/424 |
| 4,678,699 A | 7/1987 | Kritchevsky et al. | 428/175 |
| 4,689,089 A | 8/1987 | Eberhardt, Jr. et al. | 134/18 |
| 5,226,210 A | 7/1993 | Koskenmaki et al. | 29/527.5 |
| 5,294,826 A | 3/1994 | Marcantonio et al. | 257/659 |
| 6,013,376 A * | 1/2000 | Yenni, Jr. | 428/174 |

FOREIGN PATENT DOCUMENTS

| | | | |
|---|---|---|---|
| EP | 0529801 A1 | 3/1993 | H05K/9/00 |
| JP | 2-276297 | 11/1990 | K05K/9/00 |

* cited by examiner

*Primary Examiner*—Michael W. Ball
*Assistant Examiner*—Barbara Musser
(74) *Attorney, Agent, or Firm*—Alan Ball

(57) ABSTRACT

An EMI shielding enclosure, for an electronic assembly, comprising a ground plane of a printed circuit connected to a shaped EMI shielding cover. The cover results from thermoforming a composite sheet of several layers, including a carrier for a fibrous metal mat that has fibers substantially surrounded by a fiber-coat. Connection of the cover to the ground plane, to form the EMI shielding enclosure, requires the fiber-coat to adhere to the printed circuit in the vicinity of the ground plane.

4 Claims, 1 Drawing Sheet

EMI SHIELDING ENCLOSURES

This is a divisional of Application No. 09/070,994 filed May 1, 1998 now U.S. Pat. No. 6,090,728.

BACKGROUND OF THE INVENTION

1. Field of the Invention

This invention relates to electronic assemblies surrounded by enclosures that prevent passage of electromagnetic or radio frequency interference (RFI). Enclosing structures combine shielding covers with ground planes associated with the electronic assemblies. Shielding covers derive from shaped composite sheets comprising nonwoven mats of randomly oriented, low melting, metal fibers. The invention further relates to means for attaching shielding covers to ground planes to provide completed shielding enclosures.

2. Description of the Related Art

Electronic assemblies, containing interference-sensitive or signal generating devices, require isolation by shielding covers and ground planes to protect the devices or prevent damage by the signals they emit. Shielding covers often include an electrically conducting element as part of a composite. A variety of composites containing both metal and polymeric materials are known for use in many varied applications. Composites may include metal in the form of continuous sheet, perforated sheets, mesh, woven screen or non-woven webs of randomly distributed fibers. Similarly, polymer structures, combined with the various forms of metal, may include films, sheets, perforated sheets, woven material or non-woven layers with random fiber distribution. Regardless of the metal/polymer composite used, it must act as a shield for electromagnetic and radio frequency waves. The interference caused by such waves in electronic devices is commonly referred to as electromagnetic interference (EMI) or radio frequency interference (RFI), hereinafter jointly referred to as EMI.

Effective EMI shielding requires the formation of a uniform conductive enclosure around the EMI-sensitive or EMI-emitting device. U.S. Pat. No. 5,294,826 (Marcantonio et al) discloses a combined heat dissipation and laminated shielding cover which absorbs energy by magnetic effects and electro-conductive effects to shield against electromagnetic interference. The laminated cover combines layers of metallic copper on either side of a magnetic layer.

Suppression of radiated emissions from individual integrated circuits may involve the use of a shielded housing over an apparatus, e.g. a circuit board, that carries multiple integrated circuits. Such a housing is described in U.S. Pat. No. 4,661,888 (Jewell et al). The housing of U.S. Pat. No. 4,661,888 and the cover of U.S. Pat. No. 5,294,826 require attachment to a ground plane using conventional methods such as soldering to a grounded contact point or connection through a conductive gasket or multiple machine screws. These methods include time-consuming, additional steps.

An EMI shielding layer, associated with the conductive enclosure, may be in the form of a continuous layer or a discontinuous grid, such as a metal mesh or nonwoven fibrous metal mass. A continuous layer, such as a metallic plate, is the most effective for EMI shielding because no gaps exist to allow passage of EMI. However, when using a discontinuous grid, any enclosure formation process that significantly increases the maximum void dimension in the shielding layer, sometimes called the "slot effect", could cause faulty EMI shielding performance of the shielding material. Void size increases in a variety of ways including, e.g. when the grid is stretched or by damage from tearing or other processes that can break the grid structure.

Previous disclosures reveal ways of producing and shaping sheet material to provide covers that have EMI shielding capability, typically using electrically conducting layers, which are required in many applications.

For example U.S. Pat. No. 3,272,292, (Nicely), discloses a non-woven unitary metallic sheet which is fabricated by extruding a molten stream from a metallic melt into an atmosphere which reacts to form a stabilizing film about the periphery of the metal stream. The spun metal filaments are allowed to solidify, and then collected as a nonwoven fibrous mass. The mass of filaments is then compressed into a sheet-like form, and given strength by binding all or selected adjacent fibers together.

U.S. Pat. No. 4,689,089 (Gaughan) discloses an EMI shielding sheet comprising a layer of nonwoven reinforcing fibers which supports a layer of metal whiskers or fibers formed from a ductile metal or metal alloy. The EMI shielding sheet is suitable for shaping of covers by stamping. Another stampable EMI shielding construction appears in U.S. Pat. No. 4,678,699 (Kritchevsky et al). This patent notes that, "The shielding layer must be able to maintain its shielding effectiveness upon stamping." Kritchevsky further states that, "Holes formed upon tearing can dramatically reduce shielding." This statement refers to tearing of the shielding layer. Such statements reflect the fact that stamping processes tend to disrupt fibrous networks, breaking the fibers which, in the case of EMI shielding, results in poorer shielding effectiveness of the metal layers. There is no teaching of how to reduce fiber or filament breakage to a minimum during shaping.

Stamping is one method for forming shaped EMI shielding structures. This forming technology was developed in the metal industry for forming thin metal objects. It involves rapid, almost instantaneous application of mechanical force to distort a sheet into a shaped object. Stampable plastic/metal composite sheets may require heating, to soften the plastic surrounding the metal shielding layer, prior to stamping. This reduces the modulus of the plastic, allowing it to flow while the metal shielding composite responds to the high pressure, shaping force of the stamping press. The speed of this process demands high levels of ductility for the metal and high plasticity for the remainder of the composite, to absorb the applied force without rupture. This method, applied to sheet molding compound (SMC), provides automotive body panels and business machine housings using reinforced material comprising a non-woven, glass-fiber reinforcing layer, and a mat containing conductive fibers for EMI shielding, held together with a resin such as polyester. The SMC is a flat sheet prior to forming in compression dies of high tonnage presses. Material properties limit the use of SMC to simple, relatively shallow shapes. Conditions used for sharp draws, e.g. multiple rib formation in the shaped panel, may cause ripping of the shielding layer and reduction of EMI shielding performance.

As a substitute for stamping, the use of thermoforming or injection molding may be considered. Thermoforming, as it relates to the present invention, comprises heating a sheet and forming it into a desired shape. The process includes heating a thermoplastic composite sheet until it becomes soft and pliable, then using either air pressure or vacuum to deflect the softened sheet towards the surface of a mold until the sheet adopts the shape of the mold surface. Upon cooling, the sheet sets in the required shape allowing removal from the mold. Disclosures in JP 1990-276297 (Nakanishi) suggest the use of vacuum formable EMI shielding sheets, employing sandwich structures of brass filaments between plastic films. One embodiment uses a non-woven cloth of synthetic resin to reinforce the brass filaments. Reinforcement involves needle-punching of the metal fibers into the non-woven web. Application of plastic film, on both sides of the reinforced shielding layer, completes the vacuum formable sheet. Information from JP 1990-276297 includes no evidence of the condition of the EMI shielding layer after vacuum forming.

European patent EP 529801, commonly assigned with the instant application, discloses EMI shielding, add-on sheets, comprising carrier material with a metal fiber mat at least partially embedded in the carrier material. The add-on sheets provide EMI shielding covers to selected parts of a thermoformed structure. Successful use of these add-on sheets requires that they possess or develop porosity when thermoformed in contact with the thermoformable substrate blank to which they were applied. This reference addresses changes that can occur during thermoforming to impair the effectiveness of the EMI shield. These changes include breakage or beading of molten metal fibers and in extreme cases separation of the metal matrix into discontinuous islands which provide no EMI shielding. While observing a progression of damaging conditions there is no evidence of means for optimum stabilization of the EMI shield during thermoforming.

Depending on the melting point of the metal fibers, it is possible for fibers in an EMI shielding layer to melt, and rupture under the stress of stretching and shaping during thermoforming. If sufficient molten fibers break in close proximity to each other the liquid metal may flow to form a metal droplet by coalescence of multiple molten fibers. At some point in metal droplet development its size is sufficient to bleed through the surface of the EMI shielding layer. Continued flow of molten metal into a droplet produces a defect extending outside the plane of the shielding layer. Upon cooling the defect is clearly seen as a shiny protruding bead, bump or disc extending from, and disposed over the surface of the thermoformed structure. Formation of these spheroidal protrusions can adversely affect EMI shielding because the flow of molten metal, resulting in their formation, draws metal from an area surrounding the protrusion causing reduced shielding efficiency in that area. In addition, current conducting, solid spheroidal protrusions cause potential electrical shorting problems if they contact circuit elements or microdevices in the restricted space usually associated with housings for electronic assemblies. Solid protrusions can also interfere with injected resin flow when the shielding composite is an insert for injection molding.

Ideally, a shaped EMI shielding article employs an electrically conductive element, within its structure, to contain generated EMI or present a barrier to radiated EMI. At the same time the conductive element should not establish electrical contact with an electronic component, thereby causing a device to malfunction. However, effective EMI shielding enclosures require electrical continuity between a shaped EMI shield and a ground plane associated with, e.g. a printed circuit. To maintain electrical insulation of the shield, but allow access for electrical connection to the conductive element, commonly assigned patent EP 529,801 indicates the need for special connectors. Surprisingly, it was discovered that, by carefully controlling the thickness of insulation covering the electrically conducting shield, to less than 0.15 mm, the need for special connectors may be eliminated in favor of a simpler thermal bonding technique, also referred to herein as heat staking.

Several alternative solutions have been attempted to improve the effectiveness of conductive fiber based EMI shielding. The formation of pressure welds or sintered bonds between the fibers improves electrical conductivity, but reduces overall flexibility and extensibility of the welded mat. Composite metal-fiber/polymer sheets containing such sintered metal mats cannot be thermoformed without breaking many of the fibers themselves, the bonds between the fibers or both, thus reducing the shielding properties at higher stretch ratios required in thermoformed parts.

With the increasing use of advanced, EMI-sensitive electronics, a need exists for improved materials for shaping into EMI shielding covers or housings that reliably protect electronic assemblies. Methods to shape EMI shielding covers rely upon the use of moldable composites. Many shapes limit stretching of the moldable composites to shallow drawn structural features. In other cases the shapes require composites with ability to retain shielding capabilities even when complex shapes demand localized elongation of 300–500%. This condition is possible using composite structures of the invention comprising a thermoplastic sheet of carrier material, supporting a layer of randomly distributed, low melting metal fibers stabilized against fiber rupture and development of bumps during forming, by means of a coating (fiber-coating) of a thermoplastic polymer. Composite sheets of the invention provide improved EMI shielding performance by maintaining the integrity of molten metal strands during thermal shaping to introduce shallow to deep drawn features into the composite sheet.

Prior art clearly reveals problems, associated with loss of EMI shielding, when the shielding layer loses its integrity through, e.g. tearing, excessive hole formation, fiber separation and increase in the number and size of gaps. While claiming EMI shielding effectiveness, in excess of 30 dB, for a variety of formable sheets, prior art advances no teaching of properties tending to stabilize such sheets against the problems outlined above. Also there is no evidence of the variability of shielding performance of formed prior art structures. Accordingly, there is a need not only to provide effective EMI shielding but to control it in such a way that formed structures consistently show almost no evidence of undesirable features, such as tears, holes, breaks, and spheroidal protrusions such as beads, bumps and the like.

The current inventors discovered how to stabilize randomly oriented metallic fiber mats to maintain fiber continuity and conductivity to consistently provide thermoformed covers with maximum shielding capability. This contributes dual benefits of improved EMI shielding performance coupled with the potential for cost savings from reduced incidence of rejection of shielded structures after thermoforming. Additional cost savings and convenience accrues from the use of a heat staking method to connect shielding covers to conductive ground planes.

SUMMARY OF THE INVENTION

The present invention discloses EMI shielding enclosures, for surrounding electronic assemblies, components used to form the enclosures, and a method for combining the components. One embodiment combines an EMI shielding cover with a ground plane associated with a printed circuit used to interconnect the devices of the electronic assembly. The shielding cover originally exists as a composite, thermoformable planar structure combining a non-porous carrier sheet with a mat or grid of randomly oriented, low melting metal fibers. The metal fibers are substantially surrounded by a fiber-coat material, which may be coated prior to or after attachment of the metal fibers to the non-porous sheet.

The shielding cover of the invention is a shaped article formed by thermoforming of a planar sheet, including an EMI shield. The article comprises a non-porous carrier sheet, a fibrous metal mat adjacent the carrier sheet such that the metal fibers, forming the metal mat, are essentially free of defects in the form of spheroidal protrusions, and a thermoplastic fiber coat, less than 0.15 mm thick, substantially surrounding the fibers. The fiber-coat may be sprayed onto the mat or, as a pliable, sometimes heated layer, may be pressed into the fibrous metal mat to substantially surround the metal fibers, and such procedure may take place before or after attachment to the carrier material.

All components of the composite planar structure melt or soften at temperatures lower than the temperature of thermoforming. At thermoforming temperatures, the viscosity of the softened fiber-coat material is higher than the viscosity of the molten metal of the metal fiber mat. The EMI shielding sheet exhibits improved performance, particularly when formed into deep-drawn shapes with pockets having stretch ratios up to 500%.

The resulting composite sheet material may itself be thermoformed or may be an integral portion of an injection molded structure when placed, as a planar sheet, or preform, into the molding cavity prior to resin injection.

All of the various embodiments of the invention require coating of the strands of the fibrous metal mat. This leads directly to the improvements associated with the invention including reduction or prevention of flaking of the metal fibers during handling and essential absence, at thermoforming temperatures, of fiber rupture that readily results in spheroidal protrusions by coalescence of molten metal from adjacent fibers. Lack of disruption of the fibrous metal mat means improved retention of EMI shielding for composite sheets of the invention. Presence of the coating over the metal fibers further results in shielding covers being electrically insulated.

It is desirable to establish electrical connection between cover and ground plane when forming EMI shielding enclosures. Such connection is preferably readily achievable. In accordance with this requirement, the invention teaches the formation of reliable electrical connection between cover and ground plane via control of thickness of the insulating fiber coat to facilitate direct attachment, during heating, using a method described herein as heat staking.

As used herein, these terms have the following meanings.

1. The terms "fiber-coat" and "fiber-coat matrix" are synonymous as used herein to refer to that coating or material which substantially surrounds the fibers of the metal mat, providing stabilization thereto, to reduce flow of molten metal during thermoforming.

2. The term "carrier sheet" means a layer which is attached, by various means, including mechanical means, heat attachment, adhesive attachment or the like, to the metal mat and fiber-coat. The term "carrier material" is synonymous.

3. The term "melting point" as applied to a metal or metal alloy means that point at which the metal begins to become molten, i.e., the melt onset. The metal or metal alloy may not be completely melted at this point.

4. The term "softening point" of a polymer is associated with its glass transition temperature above which the polymer becomes soft and pliable.

5. The term "slot effect" refers to the phenomenon that the amount of EMI that passes through a given void is dependent on the length of the void's longest dimension and not on the total area of the void, such that a very long thin void may pass much more EMI through than a square void with smaller dimensions having many times the area of the thin void.

6. A "spheroidal protrusion" is a defect, exemplified by and synonymous with a bump or bead of exposed metal, projecting beyond the surface of an EMI shielding cover after thermoforming. Such defects occur by coalescence of molten metal produced on heating metal fibers to thermoforming temperatures. EMI shielding effectiveness decreases around the defect and the protrusion may cause short circuits by contact with circuit elements or microdevices in the restricted space usually associated with electronic packages.

7. The terms "fibrous metal mat" and "metal fiber mat" are synonymous and mean a mat formed from metal filaments.

8. The term "contact surface" refers to the portion of the mat of randomly oriented metal fiber closest to the carrier sheet.

9. The term "contact edge" refers to the flange formed around the perimeter of the thermoformed EMI shielding cover to bond it over the conductive trace of the ground plane during heat staking.

10. The term "die profile edge" is a narrow, divided or continuous rail projecting from the heating block to provide localized heating around the contact edge.

All percentages, parts and ratios herein are by weight unless specifically noted otherwise.

DETAILED DESCRIPTION OF THE INVENTION

Figure 1:
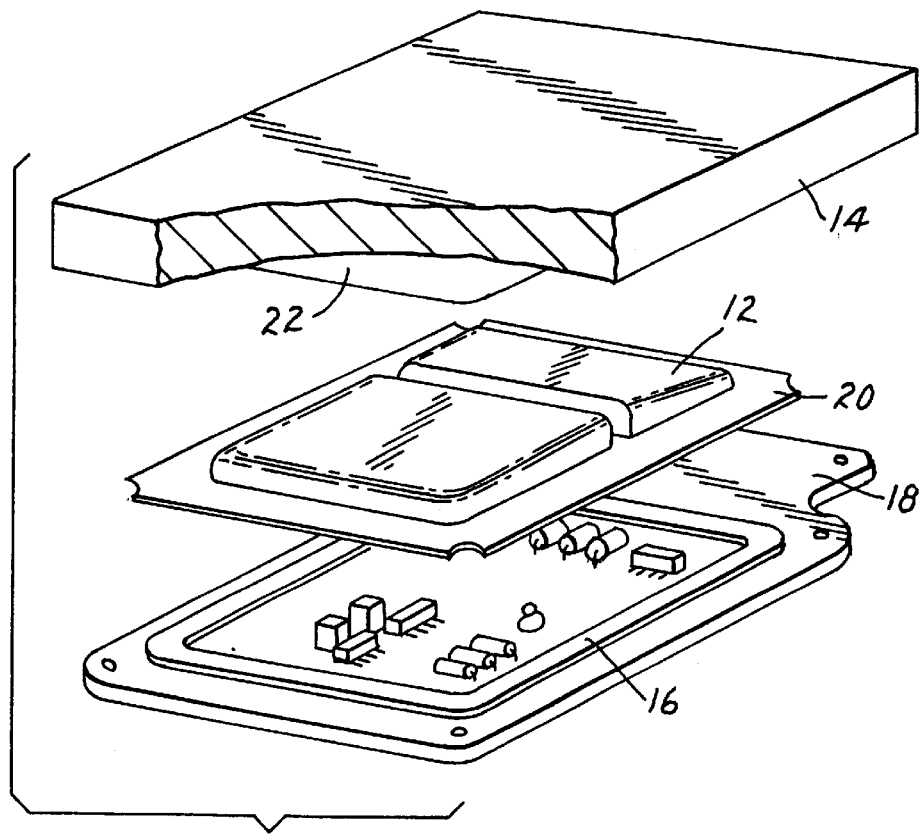
FIG. 1 is an exploded, perspective view showing alignment of parts for heat staking an EMI shielding cover to the ground plane of the printed circuit of an electronic assembly.

Electromagnetic interference (EMI) shielding of electronic devices requires, in the majority of cases, a material that blocks the interference signals associated with the devices themselves or impinging from external sources that radiate potentially damaging electromagnetic waves. A suitable form of EMI shielding comprises an enclosure surrounding an electronic assembly. The enclosure of the current invention has several parts suitably connected to form an electro-conductive structure around the assembly. Required parts include a ground plane associated with the electronic assembly and an EMI shielding cover, electrically connected to the ground plane. The basic concept of combining a shielding cover with a ground plane to provide a shielding enclosure was disclosed previously. The distinguishing features of this invention reside in the shielding cover and its ease of attachment to the ground plane of a printed circuit. Effective shielding cover materials, in this case, must meet EMI shielding requirements while responding to shape formation using a variety of molding techniques. EMI shielding articles, for use as shielding covers herein comprise a carrier sheet, usually a thermoplastic polymer sheet, a conductive EMI shielding layer in the form of an electrically conductive, randomly oriented fibrous metal mat and a polymer fiber-coat substantially surrounding the fibers of the metal mat. The metal fibers comprise a low melting metal or metal alloy, melting in a temperature range from about 70° C. to about 370° C. Within this temperature range, fibers in the fibrous metal mat become molten as required during thermoforming processes related to this invention.

In the absence of a fiber-coat around such molten metal, the influence of surface tension, creates a tendency for the metal to flow. This flow disrupts the filamentary form of the fibers. Consequently, unconstrained, a molten metal fiber is susceptible to interaction with other molten fibers to produce coalesced beads of metal that grow in size to a diameter of several millimeters. The process of coalescence redistributes EMI shielding material with the highest metal concentration close to the metal bead. Shielding material is thus lost from the area surrounding the bead which reduces the EMI shielding effectiveness of the metal mat in that area. Extreme cases of metal fiber coalescence exhibit unconnected islands of metal that grew until cessation of the flow of available molten metal. In these cases EMI shielding is minimal and usually unsatisfactory. Avoidance of coalescence provides the improvement, and consistency of performance, that distinguishes the present invention from other EMI shielding articles.

Redistribution of EMI shielding material may be substantially eliminated by constraining molten metal fibers in a form as similar as possible to that of the solid fibers. This may be accomplished by substantially surrounding the fibers with the fiber-coat material, which limits the ability of the fibers to form coalescing metal droplets. As the fiber-coat and metal fiber mat change shape during thermoforming, the fiber-coat matrix stabilizes the molten metal fiber and limits its flow. Thus, growth of metal droplets, to a level where they would bleed through the fiber-coat causing bare metal spheroidal protrusions, is much less likely to occur. Reduction of EMI shielding and short circuiting of electronic devices became relatively insignificant problems for fiber-coat stabilized metal fiber mats. Suitable materials for the fiber-coat include thermoplastic, film forming polymers having melt viscosities that exceed the viscosity of molten metal fibers during thermoforming of the fibrous metal mat. While not wishing to be bound by theory, it is believed that the fiber-coat provides channels or passageways that maintain metal fibers in filamentary form while molten, during thermoforming. Application of the fiber-coat before thermoforming is accomplished by varied methods, depending on the nature of the materials involved. For example, a non-porous, thermoplastic sheet may be softened then combined with the mat of metal fibers by pressing the mat into the material until the fibers are substantially covered. Alternatively, the fibrous metal mat may be first coated with the thermoplastic fiber-coat by such mechanisms as softening of a solid coat, spraying of a liquid coat and the like, and then the coated mat may be attached to the carrier layer, by means of adhesive, or of forcing the layers together or other conventional means. The extent of burying of the coated metal fiber mat depends upon the thickness of the fiber-coat, and the form in which it is applied. Any of the composite sheets, previously described, may be molded directly without significant disruption of the EMI shielding layer, due to the non-porous nature of the carrier material. Where a thick article is desired, the carrier layer can be provided with added thicknesses of carrier, which may be of the same or different chemical composition.

A preferred embodiment of thermoformable EMI shielding sheets used for the invention comprises a carrier sheet of polycarbonate, supporting a metal fiber mat of low melting tin/bismuth alloy fibers coated with ethylene vinyl acetate fiber-coat applied using extrusion techniques. The structure, thus described, passes between heated nip rollers to cause diffusion of the fiber coat through the metal fiber mat towards the carrier sheet.

An alternative preferred embodiment of the invention comprises a carrier sheet attached to a metal fiber mat by a layer of thermoplastic fiber-coat material such as ethylene vinyl acetate. When compressed in a heated platen press the fiber coat migrates through the metal fiber mat to engulf, or at least substantially surround the metal fibers.

In a third preferred embodiment, the invention includes four layers comprising a carrier sheet, a first adhesive layer, a metal fiber mat and a second adhesive layer. Application of pressure, from a heated platen press, causes inward flow of adhesive, from both sides of the metal mat, while promoting firm attachment of the fiber mat to the carrier sheet. This embodiment may be further modified by including electrically conductive particles, in the adhesive, to facilitate electrically conductive pathways between shaped, shielding cover articles of the invention and ground planes associated with electronic assemblies. Conductive particles include but are not limited to, metallic powders, metallic granules, metallic beads, metallic flakes, metallic fibers, metal coated powders, metal coated granules, metal coated beads, metal coated flakes and metal coated fibers.

Each of the preferred embodiments, previously described, contains fibers that are substantially surrounded by a thermoplastic resin fiber coat. This aspect of the invention distinguishes it from prior art structures including metal fibers either sandwiched between layers of thermoplastic film or partially embedded in thermoplastic resin.

Examples of polymeric materials useful as fiber-coat materials include, but are not limited to those having a softening point below about 80° C., such as ethylene vinyl acetate copolymers, vinyl acetate, amorphous polyolefins, polyethylene, polypropylene, thermoplastic elastomers, hot melt adhesives, acrylic adhesives, pressure sensitive adhesives, polyurethane, styrene butadiene styrene copolymers, styrene ethylene propylene styrene copolymers, ethylene methyl acrylate copolymers, grafted polymers and copolymers, functionalized polymers and copolymers, including maleic anhydride, acrylic acid and epoxy modified polymer and copolymers, copolyesters, latex binders, EVA dispersions, paraffin wax, and the like, including blends, mixtures and alloys thereof. While typically the fiber-coat and carrier sheet or film material will differ to provide desired properties in the final article, they could be the same if desired.

Examples of polymeric materials useful as carrier materials include, but are not limited to those having a softening point below about 150° C., such as polycarbonate, acrylonitrile butadiene styrene copolymers (ABS), styrene acrylonitrile copolymers (SAN), polystyrene, polyvinyl chloride, polyether imide, polypropylene, polyethylene, polybutylene, polyamide, thermoplastic polyesters and co-polyesters like, for example, polyethylene terephthalate, polybutylene terephthalate and polyethylene naphthalate, polymethyl methacrylate, ethylene butyl acrylate copolymers, polyacrylonitrile, polyarylketones, polyethersulfone, polyphenylene sulfide, polyurethane, styrene butadiene styrene copolymers, styrene ethylene propylene styrene copolymers, vinyl acetate, thermoplastic elastomers, grafted polymers and copolymers, functionalized polymers and copolymers and the like, including blends, mixtures and alloys thereof.

These polymers and copolymers may also contain fillers such as glass microspheres, which are especially useful when acrylic adhesives are used, colorants, antioxidants, dyes, and the like in small percentages such as will not disturb the electrical performance or EMI shielding properties of the article.

A wide variety of metals and metal alloys may be used in EMI shielding sheets of the invention. A useful metal has a melting temperature in the range of 70° C. to about 370° C. depending on the carrier polymer. Metals having the appropriate melting temperatures must be selected by one skilled in the art so that the carrier polymer will not degrade at the thermoforming temperatures required for the article. Examples of relatively low melting metals for use in composites of the present invention include tin, lead, bismuth, cadmium, indium, gallium, zinc, mixtures thereof, and their alloys. The alloy group may be augmented by alloys containing metals with higher melting points, including such metals as antimony, aluminum, copper, silver, gold, nickel, cobalt, and iron. Those skilled in the art will also be able to select other alloys to fulfill the requisite melt temperature criterion.

Thermoforming procedures used with improved EMI shielding, composite sheets of the invention do not include high impact methods such as forcible stamping even if the stamping proceeds at elevated temperature. Instead, the preferred method employs a clamping frame that holds the composite sheet for exposure to heating devices or ovens located on either side of the sheet. After absorbing heat, sufficient to suitably soften the composite sheet, and moving the frame to effect a seal between the softened sheet and the mouth of a shaping mold, the application of vacuum to the mold draws the pliable, composite sheet into the mold until there is intimate contact between the sheet and the mold surface. While this method uses vacuum to draw the sheet into the mold, it is possible to use external air pressure to urge the sheet into the mold and into contact with the mold surface as before. Also, the female mold used in the example may be replaced by a male mold suitably designed for either pressure or vacuum forming.

Shaping, by thermoforming may result in significant stretching of selected sections of a composite sheet. Some aspects of a shaped article may require elevated temperature elongation of from about 300% to about 500% by the metal mat and the carrier material. This places a strain on the integrity of the metal fibers which lose EMI shielding capability if they rupture. However, in articles of the invention, the molten metal fiber, substantially surrounded by a thermoplastic fiber-coat shows almost no tendency to flow and form spheroidal projections. As the softened composite sheet is stretched, the molten metal fibers, stabilized by the fiber-coat matrix, retain continuity. Metal fiber-to-fiber contacts not only remain intact but, as the fiber-coat stretches they are fused together, to improve the performance of the EMI shield. The existence of multi-fiber junctions causes rigidity before thermoforming. This may cause disruption of the EMI shield during thermoforming.

Conversely, the formation of multi-fiber junctions as a result of thermoforming enhances the conductivity and shielding capability of the shaped structures.

Remarkably, even with an insulating coating over fibers of the metal mat, electrical continuity between the EMI shielding layer and e.g., a ground plane of a printed circuit, may be established, while attaching the shielding cover to an electronic assembly, using common connection techniques, such as heat staking and sonic welding. This provides a significant advantage compared to earlier methods used to make electrical connection. Such methods, including high-temperature soldering to a ground point, bridging between separated cover and ground plane with a conductive, shielding gasket and multi-point securing of an enclosure with machine screws, are subject to additional process steps.

Any method may be used for electrical connection, between the EMI shielding cover and associated structures, provided it displaces polymer to expose bare metal fiber. As an example, at heat staking temperatures, the metal fibers exhibit increased hardness relative to the softened polymer fiber-coat. The hardness differential causes the metal fibers to migrate through the polymer fiber-coat, under the influence of applied force. With application of sufficient force the metal fibers exit the polymer fiber-coat becoming exposed at its surface and available for direct contact against substrates adjacent to the exposed metal fiber. This condition persists for the short time required for heat staking according to earlier disclosure. Effective electrical connection to shaped articles of the invention requires that the thickness of the fiber coat layer is less than 0.15 mm. Thickness control represents an important consideration to the surprising execution of electrical connection through an insulating fiber-coat. Using shaped covers, described herein, the connection to ground occurs simultaneously with application of the EMI shielding cover as a housing over an electronic assembly.

Figure 2:
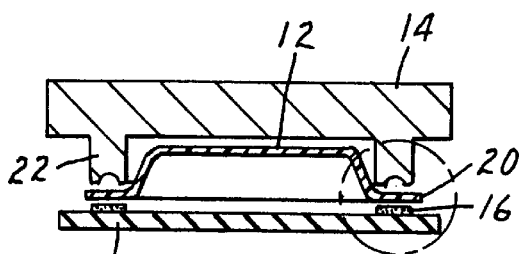
FIG. 2 is a cross sectional view showing positioning of the heating block of a staking tool to attach an EMI shielding cover to the printed circuit of an electronic assembly.
Figure 2A:
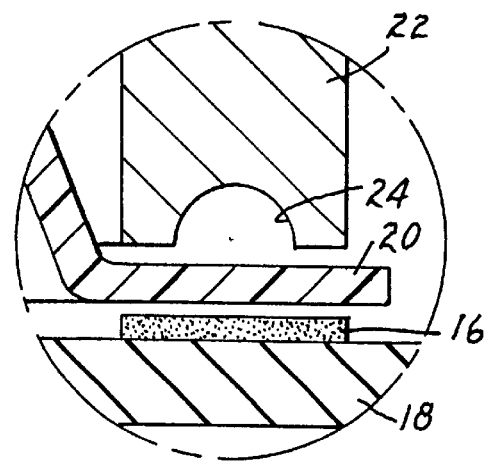
FIG. 2a is a detail view of a section from FIG. 2 showing the profile edge of the heating block.

FIGS. 1 through 2a illustrate application of a shielding cover using a heat sealing process, referred to herein as heat staking. After placing the EMI shielding cover 12 in desired alignment over the electronic assembly, application of heat and pressure, through the heat staking tool 14, bonds the shield to the conductive trace 16 of the printed circuit 18 of the electronic assembly. The conductive trace 16 is part of the ground plane of the printed circuit 18. A completed, covered assembly includes the printed circuit 18, supporting electronic components that are surrounded, and protected, by the shaped EMI shielding cover 12. Bond formation occurs between the shielding cover 12 and printed circuit 18 by adhesion, via e.g. a hot melt polymer, along the contact edge 20 of the EMI shielding cover 12. The fiber coat resin provides the bonding material at the contact edge 20.

Successful electrical connection of the shielding cover 12, to the assembly, requires displacement of the insulating, fiber coat resin, substantially surrounding metal fibers in the vicinity of the conductive trace 16 of the assembly. Removal of insulation allows contact between the bare fibers and the conductive trace 16 during the heat staking process.

Heat staking attaches an EMI shielding cover 12 over a printed circuit 18 using a heat staking tool 14 to precisely heat at least a portion of the perimeter of the shielding cover close to the contact edge 20. Alignment of the contact edge 20 with the conductive trace 16 of the printed circuit 18 usually occurs before applying heat. Precise application of heat requires design of the heat staking tool 14 according to the shape of the contact edge 20 of the shielding cover 12. The heated portion of the tool, in contact with the shielding cover, describes a track, up to only a few millimeters wide, around the perimeter of the cover. Use of the term, "die profile edge" 22 allows further description of this portion of the staking tool 14, which needs some modification for optimum shielding cover 12 attachment to the printed circuit 18. The modification appears as a groove or channel 24 machined into the profile edge 22. During heat staking of a shielding cover 12 to a printed circuit 18, the profile edge 22 raises the temperature at the contact edge 20 causing the fiber coat to soften. Pressure, applied to the heat staking tool 14, causes metal fibers, of the EMI shield 12, to establish metal to metal contact with the conductive trace 16 of the printed circuit. Softened fiber coat, displaced by this process, flows away from the contact edge 20 with some collecting in the space provided by the groove 24 in the profile edge 22. Absence of a profile edge groove 24 causes inconsistent electrical connection between the contact edge 20 and the conductive trace 16 with resulting variability in the electrical resistance of the connection.

The benefits of EMI shielding composite sheets of the invention may be extended to other applications following the discovery that the planar sheets or thermoformed preforms, made therefrom, can provide EMI shielding to injection molded articles. For this purpose, the EMI shielding structure, either in sheet form or thermoformed preform, is inserted in the mold prior to injecting the molding resin layer. This provides a layer of EMI shielding material as part of the injection molded structure.

The invention is further understood by reference to the following non-limiting examples.

EXPERIMENTAL

Composite Sheet Formation

Samples of EMI shielding material, made according to the following Examples 1C–5, were evaluated by thermoforming to the same shape, under the same shaping conditions. In particular molded EMI shielding cover samples were inspected, after the thermoforming process, for evidence of bare metal, spheroidal protrusions, as surface defects and for EMI shielding effectiveness.

Metal Fiber Mat Preparation

Fabrication of a non-woven metallic sheet involves the steps of extruding a molten stream from a metallic melt, distributing the stream on a planar surface as a randomly oriented mat of metal fibers, taking care to avoid fusion between fibers at points of intersection and thereafter allowing the metal mat to cool.

Metal Fiber Mat A

Metal fiber mat A, contains randomly oriented metal fibers, formed as previously described. The fibers comprise tin/bismuth alloy fibers weighing about 650 g/$M^2$ and melting at 138° C.

Polymer Fiber Mat B

Fiber mat B, used in comparative Example I C, is a melt-blown, non-woven, polymer web formed using a 50:50 blend of ethylene vinyl acetate copolymers VYNATHENE EY 902-30 (available from Quantum Chemical Corp.) and ESCORENE 7520 (available from Exxon Chemical Co.). The resulting melt-blown web weighs about 160 g/$M^2$.

Comparative Example 1C

Metal fiber mat A was formed directly on a surface of polymer fiber mat B to provide a composite combining a metal fiber layer with a blown microfiber polymer layer. The composite was protected on either side by several sheets of silicone release paper and pressed for 5 seconds in a platen press operating at a temperature of about 70° C., under a load of 341–454 kg to partially drive the metal fibers into the polymer layer. Multiple layers of release paper protected the metal fibers from sintering and distortion, both of which may adversely affect the EMI shielding effectiveness of subsequently thermoformed structures.

The resulting composite structure of Example 1C was porous due to the combination of an unprotected, randomly oriented metal layer with a melt blown polymer web. Porous structures cannot be thermoformed, as described below, because air passes through the sheets preventing deflection of the softened sheet during application of vacuum or air pressure. Therefore, this comparative sample was combined with a continuous sheet of 0.25 mm polycarbonate prior to the thermoforming operation. Inspection of the metal fiber mat after thermoforming revealed surface defects of spheroidal protrusions, as shiny bare metal beads unprotected by electrically insulating fiber-coat material. In this example the metal fibers were not substantially surrounded by a fiber-coat.

Example 2C

Fiber mat A was formed directly on one surface of a sheet of 0.25 mm thick polycarbonate (GE #8B35 V/M—from GE Plastics-Structured Products). A film of 0.15 mm thick ethylene vinyl acetate (BYNEL E 418—available from E.I. DuPont de Nemours), extruded at 235° C. over the metal fibers, provided a sandwich composite which then passed through a pair of heated nip rollers. The chromed steel roller, next to the BYNEL E 418 layer, operated at a surface temperature of 113° C. with a silicone release liner interposed to prevent sticking of the layer to the roller surface. A rubber roller, controlled at 96° C. abutted the surface of the polycarbonate sheet. At the prevailing temperatures of the rollers, there was insufficient polymer flow to substantially surround the metal fibers. The appearance of the laminate provided evidence of air entrapment between the layers of film and the fiber mat. A thermoformed sample, of the sandwich composite, revealed evidence of bleeding of molten metal to form spheroidal protrusions outside the ethylene vinyl acetate layer.

Example 3

Fiber mat A was formed directly on a surface of a sheet of 0.25 mm thick polycarbonate (LEXAN 8010MC from GE Plastics-Structured Products). A 0.20 mm thick film of ethylene vinyl acetate (BYNEL E 418 available from E.I. DuPont de Nemours), extruded at 235° C. over the top of the metal fibers, sealed them between polymer layers. The resulting composite then passed through a gap of about 0.50 mm formed by nip rollers operating at 121° C. A silicone release cover, over the roller contacting the BYNEL side of the composite, prevented sticking at the interface.

Example 4

A sheet of 0.25 mm thick polycarbonate (LEXAN 8010MC from GE Plastics-Structured Products) was coated with ethylene vinyl acetate (BYNEL E 418 available from E.I. DuPont de Nemours) to a thickness of 0.10 mm, using extrusion coating at 235° C. The next step of composite preparation involved formation of metal fiber mat A against the layer of ethylene vinyl acetate. A 0.10 mm thick film of ethylene vinyl acetate (BYNEL E 418 available from E.I. DuPont de Nemours), extruded at 235° C. over the top of the metal fibers, then sealed them between layers of ethylene vinyl acetate. The resulting composite then passed through a gap of about 0.50 mm between a steel roller and a back-up rubber roller, forming nip rollers, operating at 113° C. A silicone release cover, over the steel roller contacting the BYNEL side of the composite, prevented sticking at the interface.

Example 5

A 0.64 mm thick film of ethylene vinyl acetate (DUPONT ELVAX 350) was extruded at 177° C. onto metal fiber mat A, which was supported by a silicone belt. The two materials were joined by passing them through chrome plated steel nip rollers. A 20 cm×20 cm sample of the resulting composite was placed metal fiber side up onto a 30 cm×30 cm sheet of 0.26 mm thick sheet of LEXAN 8010MC polycarbonate (obtained from GE Plastics-Structured Products). This composite was pressed together in a platen press heated to 100°

C. at 455 kg for 10 seconds. The resulting composite comprises a polycarbonate carrier base, an intermediate layer of Elvax 350 and a top layer of tin bismuth fibers substantially embedded into the surface of the Elvax 350.

Example 6

Two sheets of acrylic adhesive were prepared as follows: 3M acrylic adhesive RD20789 (available from 3M), was mixed with 1.2% by weight of 30 micron diameter silver coated glass spheres obtained from Potters Industries, Inc., Parsippany, N.J. This mixture was coated onto a sheet of release liner using a notched bar coater at a wet thickness of 0.26 mm. After drying the adhesive layer sheets, one was laminated onto a 0.13 mm thick sheet of LEXAN 8010MC polycarbonate (obtained from GE Plastics-Structured Products) measuring 30 cm×30 cm, by placing the adhesive side of one of the sheets against the polycarbonate, pressing it down from the release liner side and then peeling off the release liner to transfer the adhesive layer to the polycarbonate sheet. A layer of Mat A was then placed on top of the adhesive layer. The second adhesive layer was then applied to metal fiber mat A, as described previously, producing a metal layer sandwiched between layers of conductive adhesive. This composite was placed between multiple sheets of release liner to pad the material prior to pressing in a platen press set at 455 kg load for 20 seconds at 100° C.

The Process of Thermoforming

Thermoforming, especially associated with the present invention, refers to the process that combines a shaping mold, heat and either pressure or vacuum to change a planar sheet of softened, thermoplastic material into a contoured structure which, on cooling, substantially replicates the shape of the mold. Equipment for the basic forming method includes parallel acting frames, to hold the thermoplastic sheet; heaters above and/or below the sheet-stock to be softened; molds, either male or female, to provide the shape against which the softened sheet will be thermoformed; and equipment for increasing or reducing air pressure to deflect the softened sheetstock for shaping.

Thermoformed Sample Preparation

Composite sheets of the invention had a planar structure before shaping in a thermoformer having a centrally positioned clamping system to hold a sheet between heaters positioned above and below the clamping station. Heating of a composite sheet may use either one of the heaters or both together. Examples 1C–6 used only the lower heater operating at a temperature of 538° C. Sheets were exposed to this temperature for about 0.5 minute.

Each of the composite sheets of Examples 2C, 3, 4 and 5 already included a layer of 0.25 mm thick polycarbonate while Example 6 included a 0.13 mm polycarbonate.

After softening, a sheet was positioned in close proximity to the shaping mold by moving the clamping structure. The thermoformed sample, used for evaluation, was a cylindrical bowl having a flat, circular base of 17.6 cm diameter with a circular wall extending 4.1 cm vertically from the base. With the sheet and clamping structure suitably positioned to form an air-tight seal with the upper edge of the circular wall of the mold, vacuum was applied to draw the sheet into the mold until the surface of the sheet was in close contact with the mold wall. This shaping required significant stretching of the composite sheet between the upper edge of the circular wall and the juncture between the wall and the base. After cooling, the composite material adopted the shape of the cylindrical bowl.

Metal fiber stretching is at a maximum in the corner formed by the circular wall and the base portion of the bowl-shaped composite material. This portion is therefore most subject to fiber rupture and separation during thermoforming. When the fibers become molten, extension of the metal strands is limited only by the surface tension of the molten metal. Any means to preserve the molten metal in the form of a fiber will improve potential fiber elongation. This is demonstrated by the results of forming the composite sheets of Examples 1C–6, described below and presented in Table 1.

In thermoformed bowl preparation, there was a very significant difference between Comparative Examples 1C and 2C, using a metal mat with insufficient fibercoat, and the other examples involving metal mats either substantially embedded in a polymer layer or having a polymer overcoat applied. Evidence of poorer performance of Examples 1C and 2C was the appearance, during thermoforming of the composite sheets, of metal beads by the coalescence process previously described. As the metal beads grow, they gain volume by accepting the flow of molten metal out of surrounding fibers until they emerge as isolated spheroidal protrusions outside the profile of the thermoformed articles. Existence of multiple protrusions is harmful to EMI shielding effectiveness and increases the probability of short-circuiting an electronic device.

Examples 3–6 were free from spheroidal protrusions. This shows the improvement provided by protecting the metal mat by overcoating or substantially embedding it in a polymer fiber-coat matrix before heating and shaping. Table 1 shows the results of testing composite sheets of the invention to determine incidence of metal bead formation and EMI shielding efficiency. The consistently higher shielding performance, measured in decibels (dB), for the bead-free samples, clearly demonstrates the improvement associated with these EMI shielding covers.

Example 6, having an adhesive coating over the metal fiber mat, may be adhesively attached and is capable, where needed, of establishing electrical connection with a suitable ground plane. Housings thermoformed from Example 6, attached to conductive surfaces by pressure, provide connections with electrical resistance less than 100 milliohms between the metal fiber mat A and the conductive surface.

TABLE 1

Thermoformed Sheet Performance

| Example | Oven Dwell Time (minute) | EMI Shielding (dB) | Metal Bead Formation |
|---|---|---|---|
| Example 1C | 0.46 | 20 | 7 beads |
| Example 2C | 0.45 | 37 | 11 beads |
| Example 3 | 0.46 | 45 | None |
| Example 4 | 0.46 | 50 | None |
| Example 5 | 0.59 | 50 | None |
| Example 6 | 0.46 | 50 | None |

Injection Molding of Composite Sheets and Thermoformed Preforms

Example 7

A polycarbonate sheet of about 0.13 mm thickness (LEXAN 8010MC polycarbonate from GE Plastics-Structured Products) was coated with a thin layer of polyethylene using a 10% of VYTEL PE 200 in methyl ethyl ketone, using a #5 Meyer bar. After oven-drying these sheets at 105° C. for two minutes, a sample of metal fiber mat A was applied to the VYTEL PE 200 layer. The composite was protected on either side using multiple sheets of silicone release paper, then laminated for 10 seconds, using a heated platen press operating at about 340 Kgf and 127° C. Upon cooling, the resulting samples were overcoated by hand-held spray bottle, using a solution of 10% solids ADCOTE 37P295 wax dispersion in water to a wet coating weight from about 10 gms/100cm$^2$ to about 30 gms/100cm$^2$. The completed composite sheet was dried in an oven at a temperature of 105° C. for about 10 minutes.

Injection Molding of Example 7

A pre-formed insert was made from the material of example 7 using the thermoforming equipment previously described. The top heater of the thermoformer was turned off and the bottom heater was set at 538° C. The sheet was heated before forming in the thermoforming oven for 0.23 minutes. The sheet of example 7 was formed into a substantially rectangular pre-form having dimensions of approximately 3.5 cm×9.8 cm×1.0 cm deep. This part was pre-formed to fit snugly inside an injection mold. The pre-form was then placed into one side of the injection mold (the side opposite the gate) which in turn was mounted in a 70 ton Arburg molding machine. The mold was closed and the cavity was injected with a full charge of Lexan 141R polycarbonate obtained from GE Plastics, having a melt temperature of 300° C. The injection rate was 20 cc/s, the mold temperature was 40° C., and the cool time was 15 s. The mold was opened after the part cycle was completed and the result was an injection molded part, of a molding resin, with a smooth inner surface including an electrically conductive network of tin bismuth alloy fibers having a surface resistance of less than 200 milliohms from corner to corner as measured using a Fluke Model 75 Multimeter obtained from John Fluke Mfg. Co. Inc.

Example 8

Fiber mat A was spray overcoated using a 5% solution of PETG (KODAR 6763 from Eastman Chemical Co.) in methylene chloride. Spray application of the overcoat by a Binks spray gun with a #63B nozzle gave a wet coating weight of between about 20.0 g and about 30.0 g per 100 cm$^2$. After drying at room temperature, the resulting fiber mats were heat laminated onto a 0.13 mm thick PETG (KODAR 6763) plastic sheet for 5 seconds using a heated platen press as in Example 6.

Injection Molding of Example 8

A pre-formed insert was made from the material of example 8 using the thermoforming equipment previously described. The top heater of the thermoformer was set at 316° C. and the bottom heater was set at 260° C. The sheet was heated before forming in the thermoforming oven for 0.28 minutes. The sheet of example 8 was formed into a substantially rectangular pre-form having dimensions of approximately 3.5 cm×9.8 cm×1.0 cm deep. This part was pre-formed to fit snugly inside an injection mold. The pre-form was then placed into one side of the injection mold (the side opposite the gate) which in turn was mounted in a 70 ton Arburg molding machine. The mold was closed and the cavity was injected with a full charge of Vistolen P2000 polypropylene having a melt temperature of 240° C. The injection rate was 40 cc/s, the mold temperature was 40° C. and the cool time was 30 s. The mold was opened after the part cycle was completed and the result was an injection molded, resin part with a smooth inner surface including an electrically conductive network of tin/bismuth alloy fibers having a surface resistance of less than 200 milliohms from corner to corner as measured using a Fluke Model 75 Multimeter obtained from John Fluke Mfg. Co. Inc.

Example 9

Composite sheets were prepared as described in Example 7 except the overcoat of ADCOTE 37P295 was omitted. This was not needed since the material did not require thermoforming prior to molding.

Injection Molding of Example 9

The film composite of Example 9 was taped onto the female side of the injection mold. The mold was mounted in a 150 Ton Demag Ergo Tech 150610 injection molding machine. The mold was then closed around the film which resulted in an initial cold forming of the plastic/metal fiber composite. Cycoloy HF 120 ABS/Polycarbonate blend obtained from GE Plastics, having a melt temperature of 270° C., was then injected into the mold. The injection rate was 30 cc/s, the mold temperature was 40° C., and the cooling time was 15 s. The mold was opened after the part cycle was completed and the result was an injection molded part having dimensions of approximately 4.8 cm×9.7 cm×0.4 cm with a smooth inner surface including an electrically conductive network of tin bismuth alloy fibers having a surface resistance of less than 200 milliohms from corner to comer as measured using a Fluke Model 75 Multimeter obtained from John Fluke Mfg. Co. Inc.

Example 10

Composite sheets were prepared as described in Example 8 except the overcoat of PETG was omitted. This was not needed since the material did not require thermoforming prior to molding.

Injection Molding of Example 10

The film composite of Example 10 was taped onto the female side of the injection mold. The film was preheated on the mold using a hand held heat gun for approximately 15 seconds. The mold was then closed around the film which resulted in an initial cold forming of the plastic/metal fiber composite. The mold was closed and the cavity was injected with a full charge of Cycoloy HF1120 ABS/Polycarbonate blend obtained from GE Plastics, having a melt temperature of 270° C. The injection rate was 30 cc/s, the mold temperature was 70° C., and the cooling time was 15 s. The mold was opened after the part cycle was completed and the result was an injection molded part having dimensions of approximately 4.8 cm×9.7 cm×0.4 cm with a smooth inner surface including an electrically conductive network of tin bismuth alloy fibers having a surface resistance of less than 200 milliohms from comer to comer as measured using a Fluke Model 75 Multimeter obtained from John Fluke Mfg. Co. Inc.

Example 11

A polycarbonate sheet of about 0.13 mm thickness (LEXAN 8B35 polycarbonate from GE Plastics-Structured Products) was coated, by lamination, with a layer of ethylene methyl acrylate copolymer (EMAC SP2207 from Chevron Chemical Co.—Specialty Polymers), about 0.10 mm thick. The lamination step used a heated platen press operating at 22,000 Kgf pressure for about 20 s at 125° C.

Metal fiber mat A, was placed on the EMAC SP2207 layer. The composite was protected on either side using multiple sheets of silicone release paper, then laminated for 20 s, using a heated platen press operating at about 25,000 Kgf and 110° C.

Injection Molding of Example 11

A pre-formed insert was made from the material of example 11 using the thermoforming equipment previously described. The top heater of the thermoformer was turned off and the bottom heater was set at 538° C. The sheet was heated before forming in the thermoforming oven for about 0.3 minute. The sheet of example 11 was formed into a substantially rectangular pre-form having dimensions of approximately 4.8 cm×9.7 cm×0.4 cm deep. This part was pre-formed to fit snugly inside an injection mold. The pre-form was then placed into one side of the injection mold (the side opposite the gate) which in turn was mounted in a 70 ton Arburg Allrounder 700-230-305 ECO molding machine. The mold was closed and the cavity was injected with a full charge of LEXAN 940 polycarbonate, obtained from GE Plastics, having a melt temperature of 300° C. The injection rate was about 20 cc/s, the mold temperature was about 90° C., and the cooling time was about 15 s. The mold was opened after the part cycle was completed and the result was an injection molded part of molded resin formed over an electrically conductive network of tin bismuth alloy fibers having a surface resistivity of less than 200 milliohms from corner to corner as measured using a Fluke Model 75 Multimeter obtained from John Fluke Mfg. Co. Inc.

A second sample of a preform of Example 10, made as described previously, was placed, as a preformed insert, in a mold attached to a 70 ton Arburg Allrounder 700-230-305 ECO injection molding machine. After closing, the mold cavity was filled by injection with a full charge of ABS-polycarbonate blend (Cycoloy C1200HF, obtained from GE Plastics) having a melt temperature of about 270° C. At a mold temperature of about 40° C. the resin injection rate was about 20 cc/s followed by cooling for about 15 s. The injection molded part had the same performance as the molding produced with LEXAN 940.

Example 12

A polycarbonate sheet, about 0.13 mm thick, (LEXAN 8B35 available from GE Plastics—Structured Products) was coated on both sides, by laminating about 0.10 mm of ethylene methyl acrylate copolymer (EMAC SP2207 available from Chevron Chemical Co.—Specialty Polymers) using a platen press operating at about 22,000 Kgf for about 20 s and at a temperature of about 125° C.

Metal fiber mat A was placed against one of the layers of EMAC SP 2207 before placing the composite between multiple sheets of silicone release paper then applying pressure using a heated platen press at 25,000 Kgf for about 20 s. at about 100° C.

Injection Molding of Example 12

A pre-formed insert was made from composite sheets of Example 12 as previously described for Example 11. The preform was placed in a mold attached to a 70 ton Arburg Allrounder 700-230-305 ECO injection molding machine. After closing, the mold cavity was filled by injection with a full charge of high density polyethylene (Petrothene LM6187, available from Quantum Co.) having a melt temperature of about 210° C. With mold temperature held at room temperature, the resin injection rate was about 20 cc/s followed by cooling for about 20 s. The resulting part showed good adhesion between the injected polyethylene layer and the preformed insert and had a smooth inner surface including an electrically conductive network of tin busmuth alloy fibers with a surface resistivity less than 200 milliohms measured using a Fluke Model 75 Multimeter obtained from John Fluke Mfg. Co. Inc.

Examples presented herein are not intended as limiting of the invention, the scope of which is defined by the following claims.

What is claimed is:

1. A method for forming an EMI shielding enclosure around an electronic assembly, comprising the steps of:
   (a) providing an electronic assembly, having a ground plane including a conductive trace;
   (b) providing a thermoformed shielding cover having a contact edge, said shielding cover further comprising:
      a non-porous carrier sheet;
      a fibrous metal mat having an outer-surface and a contact surface, said contact surface adjacent said carrier sheet, said metal mat comprising low melting metal fibers that melt during thermoforming of said shielding cover; and
      a resin fiber-coat applied to diffuse through said fibrous metal mat toward said non-porous carrier sheet to insulate said metal fibers, said resin fiber-coat extending less than 0.15 mm beyond said metal fibers at said outer surface of said metal mat;
   (c) aligning said contact edge with said conductive trace; and
   (d) adhering said contact edge against said conductive trace to form an electrical connection between said edge and said trace.

2. The method of claim 1 wherein said contact edge is adhered to said conductive trace, by the steps of:
   (a) placing a heating block, having a profile edge, in close proximity to said contact edge of said shielding cover such that said profile edge heats at least a portion of said contact edge to soften said fiber coat;
   (b) applying force to said heating block to urge said metallic fibers, in said portion of said contact edge, against said conductive trace to form an electrical connection therewith, said profile edge having a channel formed therein to receive said fiber coat when it softens; and
   (c) cooling said portion of said contact edge to allow said fiber coat to harden to adhere proximate said conductive trace to secure said electrical connection.

3. The method of claim 1 wherein said fiber coat comprises a pressure sensitive adhesive, said contact edge being adhered to said conductive trace by applying force to said contact edge to adhere it to said trace to secure said electrical connection.

4. The method of claim 1 wherein said fiber coat comprises a pressure sensitive adhesive containing conductive particles, said contact edge adhered to said conductive trace by applying force to said contact edge to adhere it to said trace to secure said electrical connection.

* * * * *